(12) United States Patent
Gude

(10) Patent No.: US 6,710,728 B2
(45) Date of Patent: Mar. 23, 2004

(54) DELTA-SIGMA ANALOG TO DIGITAL CONVERTER

(76) Inventor: Michael Gude, Buchenhoche 1, Kerpen (DE), 50169

(*) Notice: Subject to any disclaimer, the term of this patent is extended or adjusted under 35 U.S.C. 154(b) by 0 days.

(21) Appl. No.: 10/259,627

(22) Filed: Sep. 30, 2002

(65) Prior Publication Data

US 2003/0063021 A1 Apr. 3, 2003

(30) Foreign Application Priority Data

Oct. 2, 2001 (DE) .......................................... 101 48 799
Oct. 2, 2001 (DE) .......................................... 201 16 222

(51) Int. Cl.[7] .................................................. H03M 3/00
(52) U.S. Cl. ........................................ 341/143; 341/155
(58) Field of Search ................................ 341/143, 155, 341/120

(56) References Cited

U.S. PATENT DOCUMENTS 5,471,209 A * 11/1995 Sutterlin et al. ............ 341/143
6,509,854 B1 * 1/2003 Morita et al. ............... 341/144

* cited by examiner

*Primary Examiner*—Brian Young
*Assistant Examiner*—Joseph Lauture

(57) ABSTRACT

The present invention improves an analog front-end of a Delta-Sigma analog-to-digital converter (ADC), so that by keeping the simple construction a significant improvement of the resolution is achieved. This is done by a plurality of buffers including a first buffer [5], [7] connected to the D-input of the flip-flop [4] and/or a second buffer [6], [8] connected to the output of the flip-flop on a feedback path, and a power supply different from a power supply of the semiconductor chip so that a decoupling between the semiconductor chip and the analog front-end is achieved. Additionally the frequencies at the output of the flip-flop [4] can be reduced so that the frequencies outside the semiconductor chip are much lower than the sampling clock frequency of the flip-flop [4]. So it is possible to increase the internal sampling frequency into the GigaHertz range without fearing problems in the field of EMC.

5 Claims, 4 Drawing Sheets

Improved Delta-Sigma ADC with stabilized separated supply of additional chip external input and output buffers Fig. 1: Simple Delta-Sigma Analog to Digital Converter (prior art)
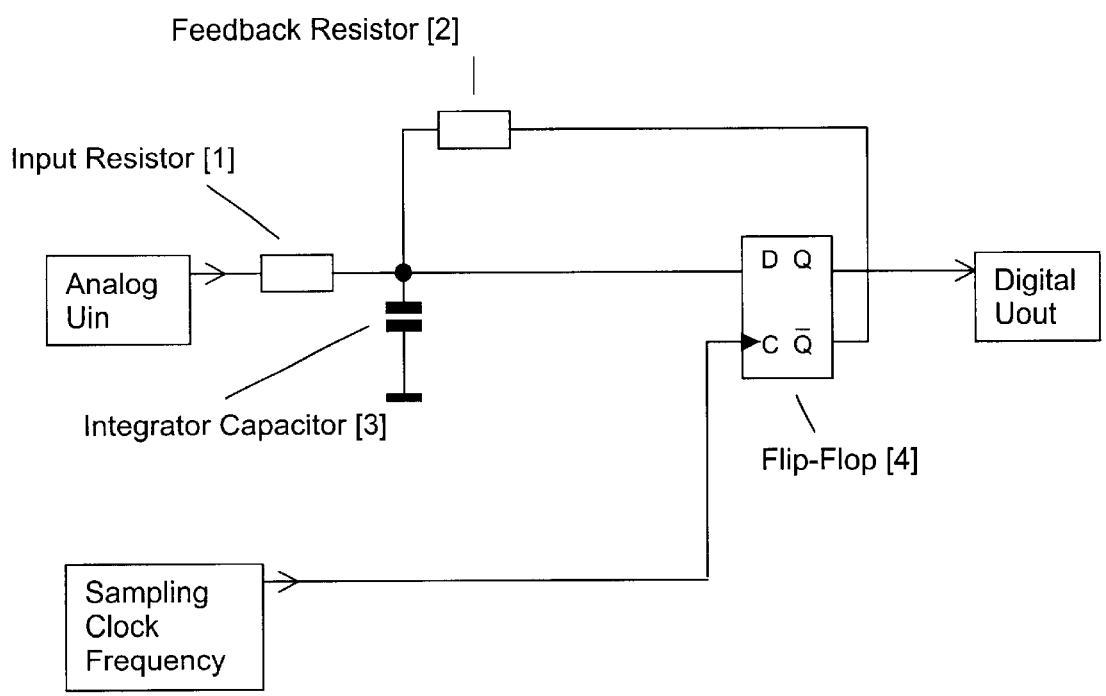

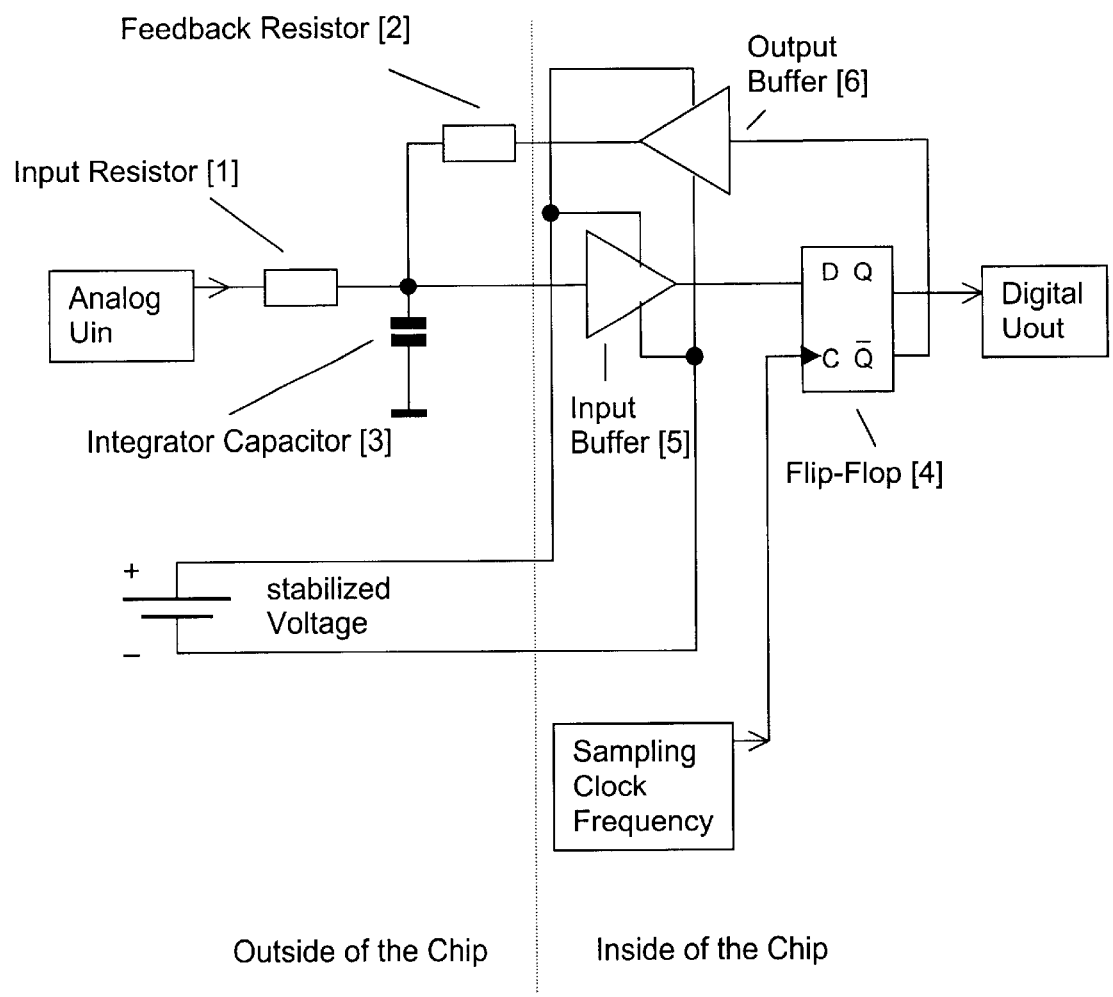
Fig. 2: Improved Delta-Sigma ADC with stabilized and separated power supply for chip internal input and output buffers

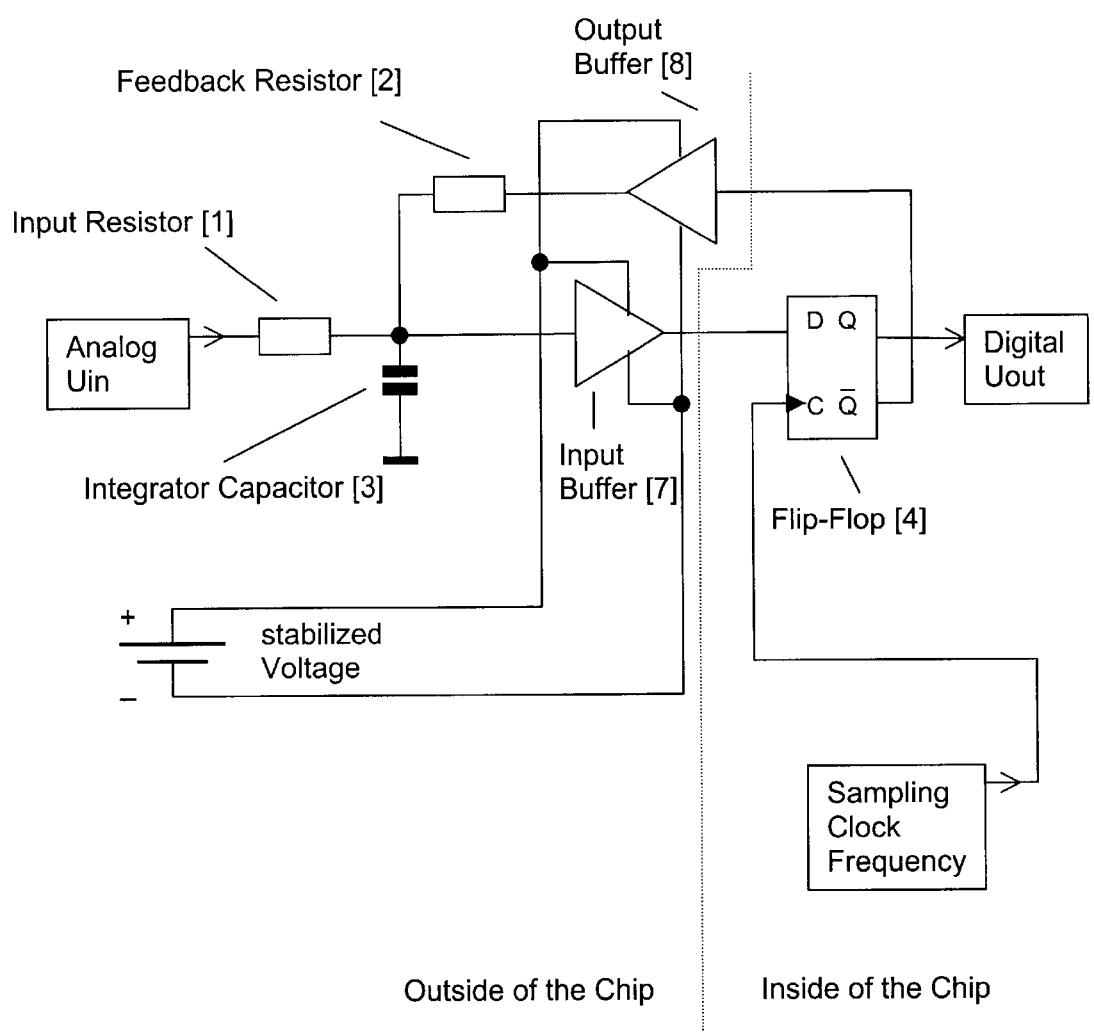
Fig. 3: Improved Delta-Sigma ADC with stabilized separated supply of additional chip external input and output buffers Fig. 4: Sample Scenario for a feed forward leading to a Hysteresis at the input of the Flip-Flop.
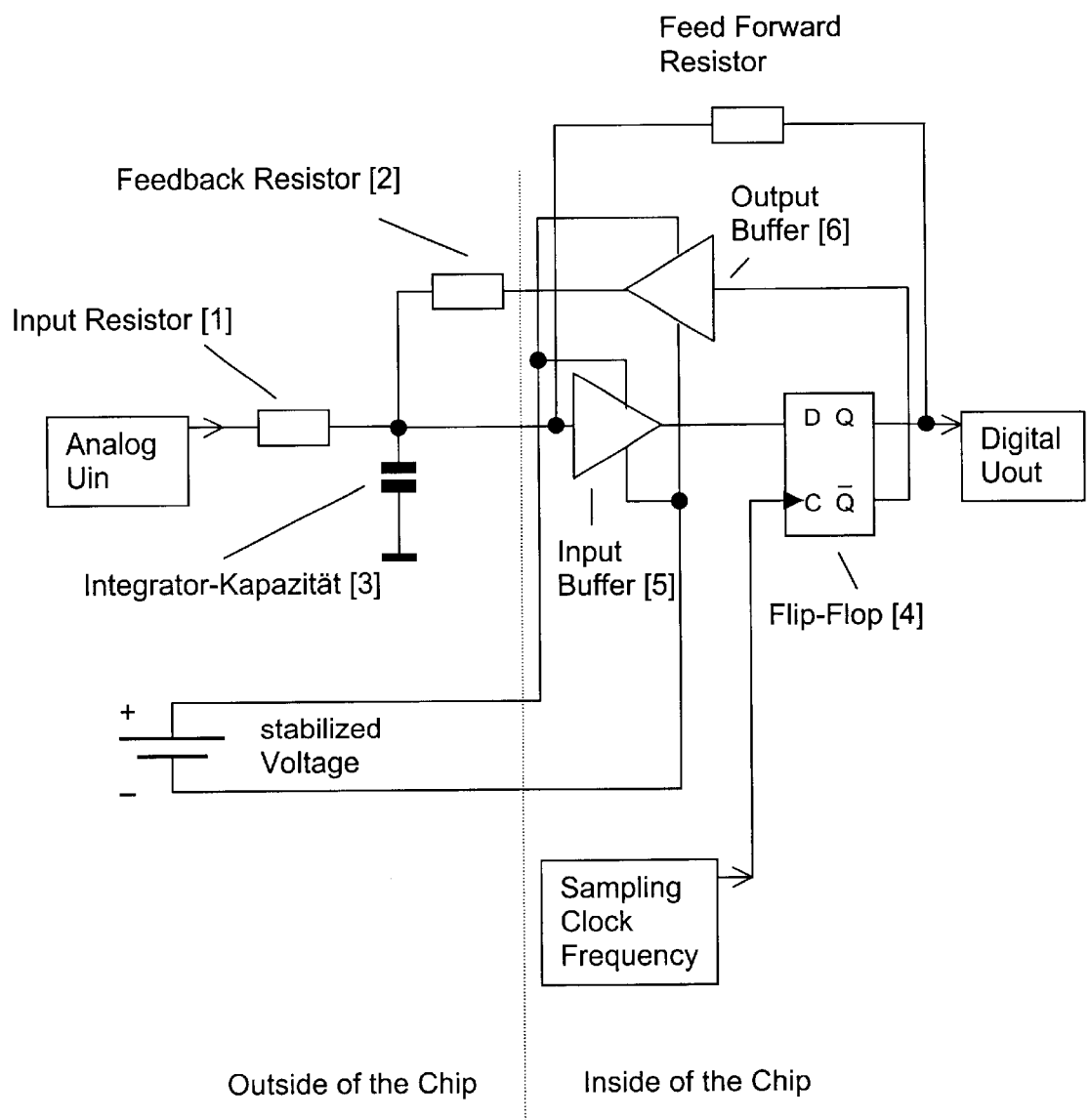

DELTA-SIGMA ANALOG TO DIGITAL CONVERTER

FIELD OF THE INVENTION

This invention is related to an improved Analog to Digital Converter.

BACKGROUND

Analog to Digital Converters (ADC) are wellknown circuitries to convert an analog input voltage into a digital output signal as a number of bits. Normally there is a linear correlation between input voltage and digital output value.

Since several years so-called Delta-Sigma ADCs are known which use an oversampling approach to convert the input signal using integrators, comparetors and digital filters to convert the analog input signal into a digital output signal. Descripton of this kind of ADC and some embodiments can be found in:

(1) Delta-Sigma Data Converters: Theory, Design, and Simulation by Steven R. Norsworthy, a. o. ISBN: 0780310454 (1996)

The advantage of Delta-Sigma ADCs Is the insensitivity for some imperfections and tolerances of the analog part of the ADC.

Due to the German patent application (2) DE 195 18 508 A1 and the Japanese patent JP 10-2734731 B2 Delta-Sigma ADCs are known which are constructed only from two resistors and one integrator capacitor. Furthermore only a digital Integrated circuit is used. (FIG. 1)

To also achieve the conversion of small input voltages the peak-peak voltage at the input of the flipflop (FF) must remain in the magnitude of the construction related crosstalk and input noise voltages. Under construction related crosstalk and input noise voltages especially crosstalk from adjacent circuitries and noise on the supply wires of the FF should is meant.

Because the supply voltage is used as reference voltage in simple Delta-Sigma ADCs the quality which means the resolution of the converter is direct correlated to the quality of the supply voltage. Without additional means this leads to a resolution of 7 bits of the ADC, what is also mentioned in (2).

SUMMARY OF THE INVENTION

The present invention shows means how to improve the analog part of a Delta Sigma ADC (analog frontend) so that by maintaining the simplicity of the construction a significant improvement of the resolution is achieved. Aimed at is a resolution of at least 13 bits because this is a must for commonly used audio codecs.

BRIEF DESCRIPTION OF THE DRAWINGS

The invention description below refers to the accompanying drawings, of which:

FIG. 1 shows a simple delta-sigma ADC (prior art);

FIG. 2 shows an improved delta-sigma ADC with stabilized separated supply of chip internal input and output buffers;

FIG. 3 shows an improved delta-sigma ADC with stabilized separated supply of additional chip external input and output buffers;

FIG. 4 shows a sample scenario for a feed forward leading to a hysteresis at the input of the flip-flop.

DETAILED DESCRIPTION OF THE INVENTION

FIG. 1 shows a simple delta-sigma type ADC with only 3 elements located outside a digital integrated circuit. This kind of ADC is already known as prior art.

FIG. 2 and FIG. 3 show embodiments of the invention. The invention is realized so that the power supply of a buffer [5][7] located in front of the D-input of the flip-flop [4] and/or a buffer [6][8] located behind the output of the flip-flop [4] in the feedback path is separated from the power supply of the semiconductor chip containing the digital circuitries, so that a decoupling between the semiconductor chip and the analog frontend is achieved.

FIG. 2 shows an embodiment with chip internal buffers [5] and [6]; an embodiment with chip external buffers is shown in FIG. 3.

The negative influence of the digital semiconductor circuitry and other unwanted noise can be kept away from the analog front end by using a separated good stabilized and noise removed power supply. This leads to a significant improvement of the bit resolution of the ADC.

As stated in claim 2 the buffers [5] and/or [6] in FIG. 2 located in the semiconductor chip are feed by special wires which are separated from the rest remainder of the semiconductor chip. This leads to the wanted decoupling between digital and analog circuitries.

As stated in claim 3 the buffers [7] and/or [8] in FIG. 3 located outside the semiconductor chip are feed by a power supply which is separated and independently stabilized from the supply voltage for the digital semiconductor chip. This again leads to the wanted decoupling between digital semiconductor chip and analog frontend.

Due to this means the resolution of the simple delta-sigma ADC can be improved to up to 16 bits.

For achieving high speed and high resolution of a delta-sigma type ADC the clock frequency for the flip-flop [4] must be high as explained in (1). This is easy to achieve internally to a digital semiconductor chip. However if the digital signals should leave the chip through buffers a variety of other problems like electromagnetic compatibility (EMC), additional power dissipation etc. occurs. Because of these the frequency of the output signal of the flip-flop [4] should be significant lower than its clock frequency which is the sample frequency of the input signal. This clock frequency can be generated fully internally to the chip, so that a radiation of this frequency is very small. So with todays technologies feedback voltages of some MHz at clock frequencies of up to one GigaHz are achievable.

Due to the U.S. patent (3) U.S. Pat. No. 6,232,902 B1 for the reason of reducing supply current and other application reasons it is advisable to limit the frequency of the output signal of the flip-flop. So (3) suggests a costly circuitry with timers to limit the maximum frequency of the output signal of the flip-flop. The present invention shows an easy improved solution.

As stated in claims 4 and 5 the delta-sigma ADC of the invention can be realized in a way that the frequency of the output voltage of the flip-flop [4] which is feed back by the feedback resistor [2] is significant lower than the clock frequency of this flip-flop. This always happens if the lowpass consisting of the feedback resistor [2] and the integrator capacitor [3] is demensioned so that a change of the output voltage of the flip-flop is not influencing the input voltage of the flip-flop within one clock cycle (claim 4).

The same behavior is achievable by a small internal feed forward in the signal path. This leads to a small hysteresis in the input path of the flip-flop (claim 5). The described embodiments are of advantage because the time resolution of the feedback voltage is mainly influenced by the clock frequency of the flip-flop [4]. This improved time resolution even is maintained when the output frequency of the flip-flop is reduced.

As stated in claim 6 the frequency of the sampling clock of the flip-flop [4] is generated by a not frequency stabilized oscillator. High not stabilized frequencies in the upper megahertz or even gigahertz range can be easily generated by so-called ring oscillators on chip. Although the frequency is influenced by the supply voltage, the temperature and manufacturing tolerances these frequencies can be used for the flip-flop [4]. To keep the specified quality and resolution of the ADC only a minimum frequency limit must be maintained. Higher clock frequencies only improve the quality of the ADC. If the output data rate of the ADC should have a fixed frequency the data rate can be converted into a constant frequency by the digital portion of the ADC in a decimator or a digital filter.

What is claimed is:

1. An analog front-end of a Delta-Sigma analog-to-digital converter (ADC) for a semiconductor chip, the converter comprising: an input resistor [1], a feedback resistor [2], an integrator capacitor, a flip-flop [4] a plurality of buffers including a first buffer [5], [7] connected to the D-input of the flip-flop [4] and/or a second buffer [6], [8] connected to the output of the flip-flop on a feedback path, and a power supply different from a power supply of the semiconductor chip so that a decoupling between the semiconductor chip and the analog front-end is achieved and wherein the buffers [5] and/or [6] are internal to said semiconductor chip and are connected separately from the remainder of the semiconductor chip.

2. An analog front-end of a Delta-Sigma analog-to-digital converter ADC as in claim 1 wherein said buffers [7] and/or [8] are located outside the semiconductor chip and are fed by a power supply which is separated and independently stabilized from the supply voltage of the semiconductor chip so that a decoupling between said semiconductor chip and analog front-end is achieved.

3. An analog front-end of a Delta-Sigma analog-to-digital converter ADC as in claim 1 wherein a frequency of the output voltage of the flip-flop [4] which is fed back by the feedback resistor [2] is significantly lower than a frequency of a sampling clock of this flip-flop, this difference in the frequency of the output voltage of the flip-flop and of the sampling clock of the flip-flop being achieved by dimensioning the lowpass filter consisting of the feedback resistor [2] and the integrator capacitor [3] so that a change in the output voltage of the flip-flop does not influence the input voltage of the fip-flop within one clock cycle.

4. An analog front-end of a Delta-Sigma analog-to-digital converter ADC as in claim 1 wherein a frequency of an output voltage of the flip-flop [4] which is fed back by the feedback resistor [2] is significantly lower than a frequency of a sampling clock of this flip-flop, this difference in the frequency of the output voltage of the flip-flop and of the sampling clock of the flipflop being achieved by a small internal feed forward in the signal path which leads to a small hysteresis in the signal path.

5. An analog front-end of a Delta-Sigma analog-to-digital converter ADC as in claim 1 wherein the frequency of the sampling clock of the flip-flop [4] comes from an oscillator whose frequency has not been stabilized.

* * * * *